United States Patent
Huang

(10) Patent No.: US 9,325,318 B1
(45) Date of Patent: Apr. 26, 2016

(54) POST DRIVER

(71) Applicant: TAIWAN SEMICONDUCTOR MANUFACTURING COMPANY LTD., Hsinchu (TW)

(72) Inventor: Tien-Chien Huang, Hsinchu (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 0 days.

(21) Appl. No.: 14/743,236

(22) Filed: Jun. 18, 2015

Related U.S. Application Data

(60) Provisional application No. 62/084,981, filed on Nov. 26, 2014.

(51) Int. Cl.
  *H03B 1/00* (2006.01)
  *H03K 3/00* (2006.01)
  *H03K 19/0185* (2006.01)

(52) U.S. Cl.
  CPC ............ *H03K 19/018557* (2013.01); *H03K 19/018507* (2013.01)

(58) Field of Classification Search
  CPC ............ H03K 19/00361; H03K 19/00315; H03K 19/0013; H03K 17/04126; H03K 17/063; H03K 17/0822; H04L 25/028; H04L 25/0272
  USPC ............ 327/108–112, 333, 427, 434, 437, 327/374–383; 326/82, 83, 87
  See application file for complete search history.

(56) References Cited

U.S. PATENT DOCUMENTS

| | | | | |
|---|---|---|---|---|
| 3,976,984 A * | 8/1976 | Hirasawa | ............ | G04G 9/0047 326/62 |
| 4,922,135 A * | 5/1990 | Mollier | ............ | H03K 19/09436 326/115 |
| 2006/0114054 A1* | 6/2006 | Giduturi | ............ | G11C 16/30 327/543 |
| 2007/0171708 A1* | 7/2007 | Tedrow | ............ | G11C 11/5642 365/185.03 |
| 2008/0187089 A1* | 8/2008 | Miyayama | ............ | G11C 19/28 377/79 |
| 2010/0315276 A1* | 12/2010 | Ogawa | ............ | H03K 17/302 341/144 |
| 2013/0028014 A1* | 1/2013 | Guo | ............ | G11C 7/062 365/163 |
| 2013/0207694 A1* | 8/2013 | Hsu | ............ | H03K 19/0013 327/108 |

OTHER PUBLICATIONS

Tae-Hyoung Kim, Uk-Rae Cho, and Hyun-Geun Byun, A 1.2V Multi Gb/s/pin Memory Interface Circuits with High Linearity and Low Mismatch, IEEE International Symposium on Circuits and Systems (ISCAS), 2005, p. 1847-1850 vol. 2, Hwasung, Korea.

(Continued)

*Primary Examiner* — Lincoln Donovan
*Assistant Examiner* — Thomas Skibinski
(74) *Attorney, Agent, or Firm* — WPAT, P.C., Intellectual Property Attorneys; Anthony King

(57) ABSTRACT

A post driver comprises a source follower and a first sub-unit. The source follower includes an input to receive a first voltage from a pad, and an output to provide a second voltage. The first sub-unit includes a first transistor and a second transistor. The first transistor is coupled between the pad and a first power rail, and is configured to operate in a sub-threshold region in response to the second voltage and a first range of the first voltage. The second transistor is coupled in parallel with the first transistor between the pad and the first power rail, and is configured to electrically connect the pad to the first power rail in response to a second range of the first voltage.

20 Claims, 9 Drawing Sheets

(56) References Cited

OTHER PUBLICATIONS

Uk-Rae Cho, Tae-Hyoung Kim, Yong-Jin Yoon, Jong-Cheol Lee, Dae-Gi Bae, Nam-Seog Kim, Kang-Young Kim, Young-Jae Son, Jeong-Suk Yang, Kwon-Il Sohn, Sung-Tae Kim, In-Yeol Lee, Kwang-Jin Lee, Tae-Gyoung Kang, Su-Chul Kim, Kee-Sik Ahn and Hyun-Geun Byun, A 1.2V 1.5Gb/s 72Mb DDR3 SRAM, IEEE Journal of Solid-State Circuits, 2003, p. 1943-1951, Hwasung, Korea.

Kyoung-Hoi Koo, Soo-Kyung Lee, Jin-Ho Seo, Myeong-Lyong Ko and Jae-Whui Kim, A Versatile I/O with Robust Impedance Calibration for Various Memory Interfaces, IEEE International Symposium on Circuits and Systems (ISCAS), 2006, Youngin, Korea.

\* cited by examiner

POST DRIVER

PRIORITY CLAIM AND CROSS REFERENCE

This application claims the benefit of provisional application Ser. 62/084,981 filed on 26 Nov. 2014, entitled "POST DRIVER," the disclosure of which is hereby incorporated by reference in its entirety.

BACKGROUND

In recent years, memory interface specifications have been significantly updated to meet the increasing requirements for high-speed processing. Joint Electron Device Engineering Council (JEDEC) defines standards for the requirements of linearity for post drivers of memory circuits. A post driver is utilized to adjust a voltage level of an input/output (I/O) driver circuit, and to compensate the impedance of the I/O driver circuit so as to alleviate the effect of reflection waves. Moreover, a post driver is utilized to improve the integrity of output signals of the I/O driver circuit. According to JEDEC's standards, in a given direct-current (DC) bias condition, the effective turn-on resistance ($R_{ON}$) of a post driver needs to fall within certain ranges. As the JEDEC's standards migrate from double data rate third generation (DDR3), double data rate fourth generation (DDR4) to low power double data rate fourth generation (LPDDR4), the allowable ranges of effective $R_{ON}$ of the post driver have been further narrowed down.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
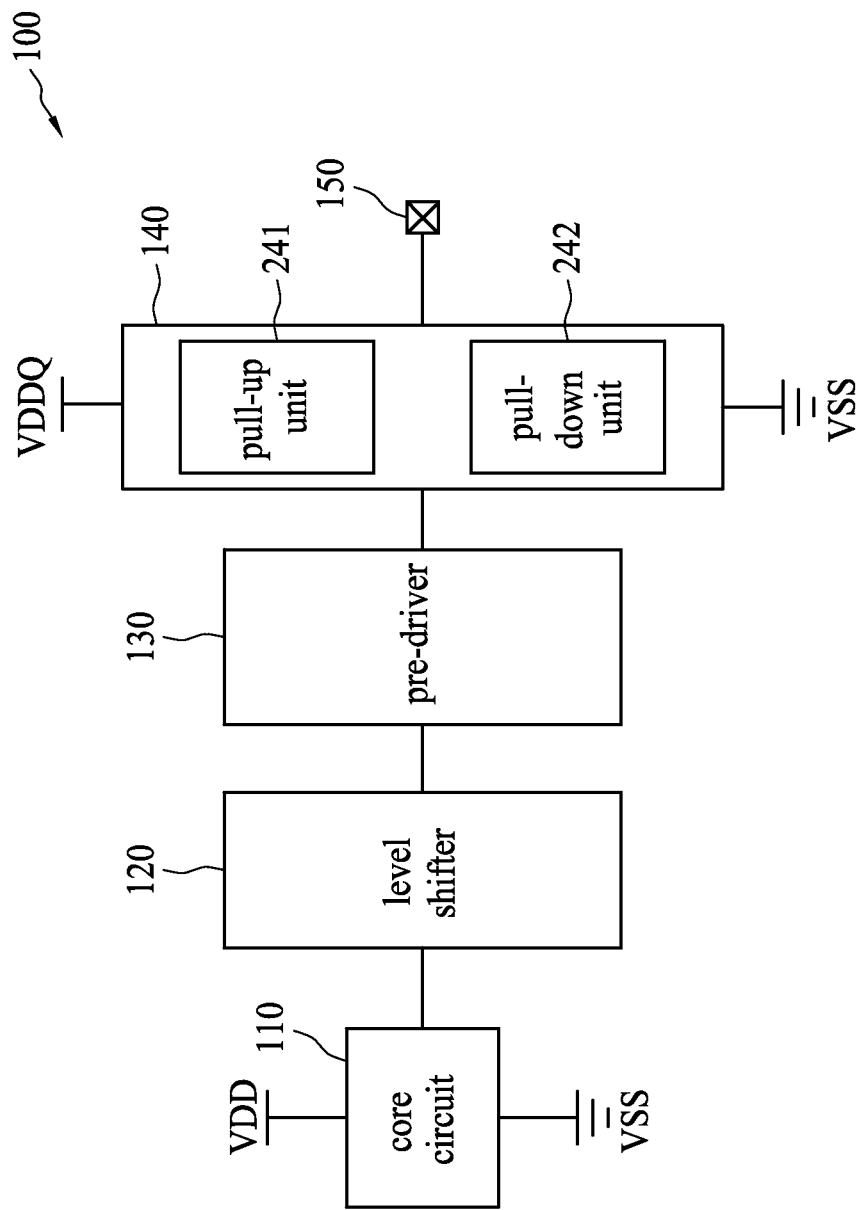
FIG. 1 is a block diagram of an integrated circuit system, in accordance with some embodiments.

The following disclosure provides many different embodiments, or examples, for implementing different features of the provided subject matter. Specific examples of elements and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

It will be understood that when an element is referred to as being "connected to" or "coupled to" another element, it may be directly connected to or coupled to the other element, or intervening elements may be present. In the below description, a signal is asserted with a logical high value to activate a corresponding device when the device is active high. In contrast, the signal is deasserted with a low logical value to deactivate the corresponding device. When the device is active low, however, the signal is asserted with a low logical value to activate the device, and is deasserted with a high logical value to deactivate the device.

FIG. 1 is a block diagram of an integrated circuit system 100, in accordance with some embodiments. Referring to FIG. 1, the integrated circuit system 100 comprises a core circuit 110, a level shifter 120, a pre-driver 130, and a post driver 140. The level shifter 120, pre-driver 130 and post driver 140 are serially connected in order between the core circuit 110 and a pad 150.

The core circuit 110 operates in a first power domain between a VDD power rail that provides a power supply voltage, and a VSS power rail that provides a reference voltage, for example, a ground voltage. The post driver 140 operates in a second power domain between a VDDQ power rail and a VSS power rail. Moreover, the power supply voltage VDD, for example, 0.8 volt (V), is lower than the power supply voltage VDDQ, for example, 1.5V in accordance with JEDEC's DDR3 standard or 1.2V in accordance with JEDEC's DDR4 standard.

The level shifter 120 and the pre-driver 130 are configured to shift signals of the core circuit 110 from a low voltage domain (0 to VDD) to a high voltage domain (0 to VDDQ) required by the post driver 140. The post driver 140 comprises a pull-up unit 241 and a pull-down unit 242, which will be discussed below in detail with reference to FIGS. 2A and 2B, respectively.

According to JEDEC's standards, the effective turn-on resistance ($R_{ON}$) of a post driver is required to fall within certain ranges. Requirements for the $R_{ON}$ of a post driver under the "double data rate third generation" (DDR3), "double data rate fourth generation" (DDR4) and "low power double data rate fourth generation" (LPDDR4) are listed in Table 1 below.

TABLE 1

|  | DC $R_{ON}$ | DDR3 | | DDR4 | | LPDDR4 (drafted) | |
|---|---|---|---|---|---|---|---|
| pull-up | Spec. 1 | 80% VDDQ | 0.6~1.1 (RZQ/7) | 110% VDDQ | 0.8~1.1 (RZQ/7) | 50% VDDQ | 0.8~1.1 (RZQ/7) |
|  | Spec. 2 | 50% VDDQ | 0.9~1.1 (RZQ/7) | 80% VDDQ | 0.9~1.1 (RZQ/7) | 33% VDDQ | 0.9~1.1 (RZQ/7) |
|  | Spec. 3 | 20% VDDQ | 0.9~1.4 (RZQ/7) | 50% VDDQ | 0.9~1.25 (RZQ/7) | −10% VDDQ | 0.8~1.2 (RZQ/7) |
| pull-down | Spec. 1 | 80% VDDQ | 0.9~1.4 (RZQ/7) | 110% VDDQ | 0.9~1.25 (RZQ/7) | 50% VDDQ | 0.9~1.2 (RZQ/7) |
|  | Spec. 2 | 50% VDDQ | 0.9~1.1 (RZQ/7) | 80% VDDQ | 0.9~1.1 (RZQ/7) | 33% VDDQ | 0.9~1.1 (RZQ/7) |
|  | Spec. 3 | 20% VDDQ | 0.6~1.1 (RZQ/7) | 50% VDDQ | 0.8~1.1 (RZQ/7) | −10% VDDQ | 0.8~1.1 (RZQ/7) |

Table 1 shows the JEDEC's $R_{ON}$ linearity specification in various DC conditions. As the standard migrates from DDR3, DDR4 to LPDDR4, the range of the allowable $R_{ON}$ becomes narrower. For example, in the DDR3 standard, the allowable Ron value of a pull-up unit measured at 80% VDDQ ranges from 0.6 times RZQ/7 to 1.1 times RZQ/7, where RZQ is 240 ohms nominal and RZQ/7 is approximately 34.3±10% ohms nominal according to the JEDEC's $R_{ON}$ linearity standard. Further, in the DDR4 and LPDDR4 standards, the allowable $R_{ON}$ value of a pull-up unit measured at 80% VDDQ ranges from 0.9 times RZQ/7 to 1.1 times RZQ/7. Moreover, in the JEDEC's LPDDR4 standard (drafted version), the voltage measured points of both the pull-up unit and the pull-down unit are −10% VDDQ, 33% VDDQ and 50% VDDQ, which are different from the voltage measured points stipulated in JEDEC's DDR3 and DDR4 standards. Therefore, the $R_{ON}$ of I/O drivers designed in accordance with the DDR3 and DDR4 standards may not meet the required ranges defined in the LPDDR4 standard.

Figures 2A, 2B:
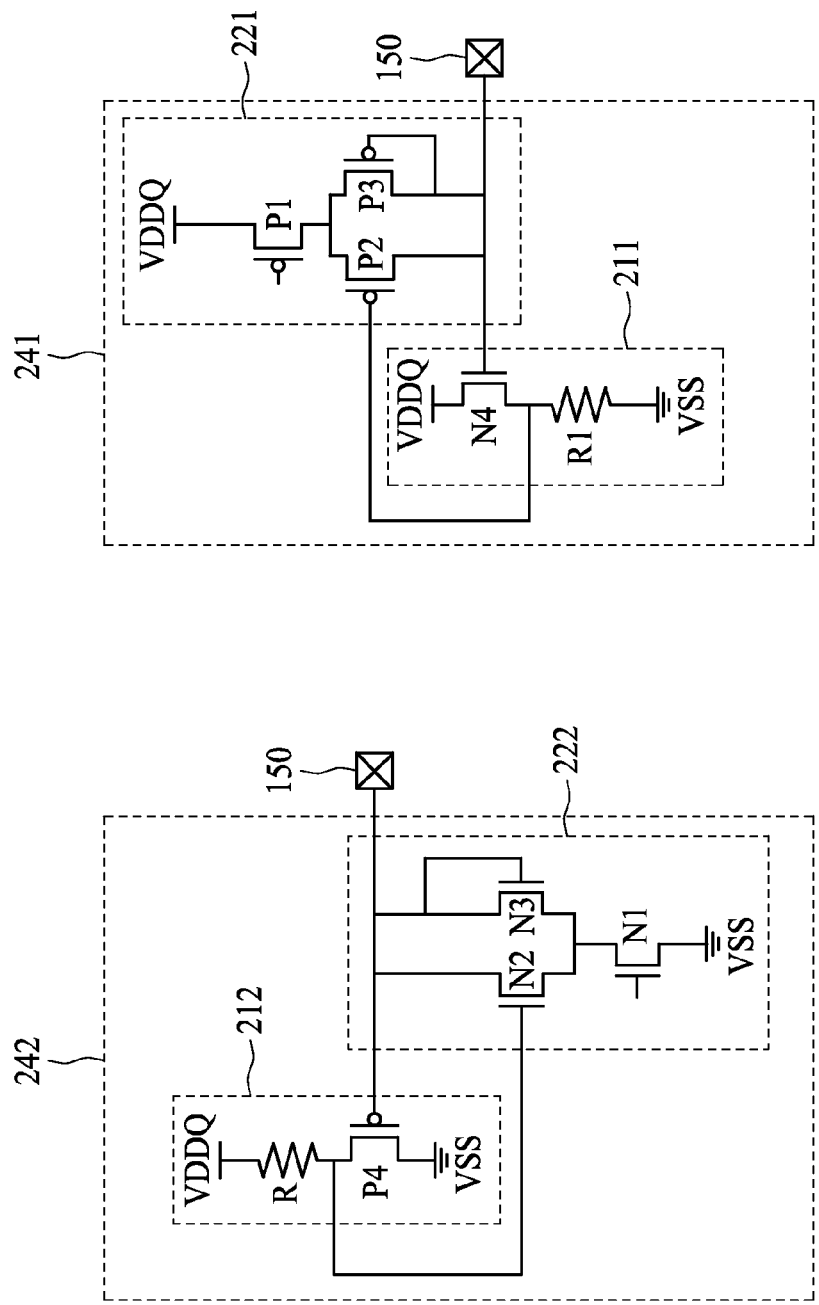
FIG. 2A is a circuit diagram of a pull-down unit of a post driver illustrated in FIG. 1, in accordance with some embodiments.
FIG. 2B is a circuit diagram of a pull-up unit of the post driver illustrated in FIG. 1, in accordance with some embodiments.

FIG. 2A is a circuit diagram of the pull-down unit 242 of the post driver 140 illustrated in FIG. 1, in accordance with some embodiments. Pull-down unit 242 is configured to pull the pad 150 to a low voltage level (VSS). Referring to FIG. 2A, the pull-down unit 242 includes a source follower 212 and a pull-down sub-unit 222.

The source follower 212 operates between a VDDQ power rail and a VSS power rail, and comprises a transistor P4 and a resistive device R. In an embodiment, the transistor P4 includes a p-type metal-oxide-semiconductor (PMOS) transistor. A gate of the transistor P4, which serves as an input of the source follower 212, is connected to the pad 150. A source of the transistor P4, which serves as an output of the source follower 212, is connected to one end of the resistive device R and to the pull-down sub-unit 222. A drain of the transistor P4 receives VSS. The resistive device R is connected between the source of the transistor P4 and VDDQ. In an embodiment, the resistive device R is a resistor. The resistive device R is configured such that the transistor P4 is turned on in response to a first range of a voltage level at the pad 150, and turned off in response to a second range of the voltage level at the pad 150. In some embodiments, the first range of the voltage level includes but is not limited to −10% VDDQ to 50% VDDQ, and the second range of the voltage level includes but is not limited to 50% VDDQ to 110% VDDQ. Moreover, the resistance of the resistive device R is approximately several kilo-ohms.

The pull-down sub-unit 222 includes transistors N1, N2 and N3. In an embodiment, transistors N1, N2 and N3 include n-type metal-oxide-semiconductor (NMOS) transistors. Transistor N1 serves as a switch to enable or disable the function of the pull-down sub-unit 222. A gate of the transistor N1 receives a voltage signal (not shown) for controlling the transistor N1 to turn on or turn off. A source of the transistor N1 receives a reference voltage VSS. As a result, transistor N1 is turned on when its gate is biased at VDDQ, and turned off when its gate is biased at VSS.

Transistor N2 is connected in parallel with the transistor N3. A gate of the transistor N2 is connected to the source of the transistor P4. A drain of the transistor N2 is connected to the pad 150 and the gate of transistor P4. A source of the transistor N2 is connected to the drain of the transistor N1.

Transistor N3 is a diode-connected transistor. A gate of the transistor N3 is connected to its drain, which in turn are together connected to the pad 150 and the gate of the transistor P4. A source of the transistor N3 is connected to the drain of the transistor N1.

Assume that the threshold value of an n-type transistor is Vtn and the threshold value of a p-type transistor P4 is Vtp, where Vtn is a positive value and Vtp is a negative value and Vtn equals |Vtp|. The operation modes of a MOS transistor, depending on the voltage levels of the gate, drain and source terminals, are listed in Table 2 below for ready reference.

TABLE 2

| mode of operation | type | |
|---|---|---|
|  | NMOS | PMOS |
| cut-off region | VGS < Vtn | |VGS| < |Vtp| (or VSG > Vtp) |
| linear region | VGS > Vtn; VGD > Vtn | |VGS| > |Vtp|; |VGD| > |Vtp| |
| sub-threshold region | VGS > Vtn; VGD = Vtn | |VGS| > |Vtp|; |VGD| = |Vtp| |
| saturation region | VGS > Vtn; VGD < Vtn | |VGS| > |Vtp|; |VGD| < |Vtp| |

In operation, the p-type transistor P4 is turned on in response to the first range of the voltage level at pad 150. With the resistive device R, a relatively small current flows from the VDDQ supply via transistor P4 to VSS. Moreover, transistor P4 is expected to operate largely in the saturation region. As a result, a voltage difference |Vtp| is established between the source and gate of the transistor P4. Since the source of the transistor P4 is connected to the gate of the transistor N2, and the gate of the transistor P4 is connected to the drain of the transistor N2, a same voltage difference |Vtp| between the gate and drain of the n-type transistor N2 is established. This voltage difference (VGD=|Vtp|=Vtn) ensures that the n-type transistor N2 operates in the sub-threshold region. In the meantime, the transistor N3 is expected to operate largely in the cut-off region. Consequently, a relatively large current flows from pad 150 via transistors N2 and N1 towards VSS, connecting the pad 150 to ground. The pull-down unit 242 thus ensures linearity of the post driver 140 in response to the first range of the voltage level at the pad 150.

Furthermore, the p-type transistor P4 is turned off in response to the second range of the voltage level at the pad 150. Transistor N3 is turned on and, due to its diode-connected structure, operates in the saturation region. In the meantime, transistor N2 is expected to operate largely in the saturation region. In an embodiment, transistor N3 is designed with a greater aspect ratio (defined as channel width W over channel length L, or W/L) than transistor N2. As a result, a relatively large current flows from pad 150 via transistors N3 and N1 towards VSS, connecting the pad 150 to ground. The pull-down unit 242 thus ensures linearity of the post driver 140 in response to the second range of the voltage level at the pad 150. In some embodiments, the aspect ratio of transistor N3 is one and a half times that of transistor N2.

Effectively, the parallel connected transistors N2 and N3 provide linearity for the post driver 140 between the pad 150 and a node (the drain of transistor N1). When the voltage level at the pad 150 falls within the first range, in some embodiments the n-type transistor N2 is turned on and works in the sub-threshold region while the n-type transistor N3 is turned off. Since most of the current flows through the transistor N2, the effective turn-on resistance of the parallel connected structure is dominated by the effective turn-on resistance of the n-type transistor N2. Moreover, when the voltage level at the pad 150 falls within the second range, in some embodiments the n-type transistors N2 and N3 are turned on and work in the saturation region. Since the transistor N3 has a greater aspect ratio than the transistor N2 and thus most of the current flows through the transistor N3, the effective turn-on resistance of the parallel connected structure is dominated by the effective turn-on resistance of the n-type transistor N3.

In some embodiments, the n-type transistor N1 is designed with a smaller aspect ratio than the n-type transistors N2 and N3 so as to meet the I/O leakage current requirement defined by the JEDEC. The pull-down unit 242 described and illustrated in FIG. 2A is advantageous in that, for example, spacing to avoid p-type transistor and n-type transistor from latch-up effects can be reduced, and thus the density of the integrated circuit can be increased. Furthermore, mismatch of threshold voltage between p-type transistor and n-type transistor is alleviated because the gate to drain voltage (VGD) of the transistor N2 is substantially clamped at |Vtp| when the voltage level at the pad 150 is relatively low, for example, within the first range. In addition, the electromigration (EM) requirement for the resistive device R is not strict because the source follower 212 is not used to drive the stage connected to the pad 150. As a result, the resistive device R used in the source follower 212 does not occupy a large cell area. In some existing approaches, however, a resistor used to maintain linearity is connected between an output pad (such as the pad 150) and a circuit node (such as the drain of transistor N1). Nevertheless, as the device feature shrinks, to meet the requirement of high output current for a post driver, the resistor size cannot shrink as well, resulting in an undesired area cost to the integrated circuit.

FIG. 2B is a circuit diagram of the pull-up unit 241 of the post driver 140 illustrated in FIG. 1, in accordance with some embodiments. Pull-up unit 241 is configured to pull the pad 150 to a high voltage level (VDDQ). Referring to FIG. 2B, the pull-up unit 241 includes a source follower 211 and a pull-up sub-unit 221.

The source follower 211 operates between a VDDQ power rail and a VSS power rail, and comprises a transistor N4 and a resistive device R1. In an embodiment, the transistor N4 includes an NMOS transistor. A gate of the transistor N4, which serves as an input of the source follower 211, is connected to the pad 150. A source of the transistor N4, which serves as an output of the source follower 211, is connected to one end of the resistive device R1 and to the pull-up sub-unit 221. A drain of the transistor N4 receives VDDQ. The resistive device R1 is connected between the source of the transistor N4 and VSS. In an embodiment, the resistive device R1 is a resistor. The resistive device R1 is configured such that the transistor N4 is turned on in response to a second range of a voltage level at the pad 150, and turned off in response to a first range of the voltage level at the pad 150. In some embodiments, the first range of the voltage level includes but is not limited to −10% VDDQ to 50% VDDQ, and the second range of the voltage level includes but is not limited to 50% VDDQ to 110% VDDQ. Moreover, the resistance of the resistive device R1 is approximately several kilo-ohms.

The pull-up sub-unit 221 includes transistors P1, P2 and P3. In an embodiment, transistors P1, P2 and P3 include PMOS transistors. Transistor P1 serves as a switch to enable or disable the function of the pull-up sub-unit 221. A gate of the transistor P1 receives a voltage signal (not shown) for controlling the transistor P1 to turn on or turn off. A source of the transistor P1 receives VDDQ. As a result, transistor P1 is turned on when its gate is biased at VSS, and turned off when its gate is biased at VDDQ. In an embodiment, a same voltage signal is applied to the gate of transistor N1 illustrated in FIG. 2A and the gate of transistor P1. As a result, in response to a high voltage signal, transistor N1 is turned on and pull-down unit 242 is enabled, while transistor P1 is turned off and pull-up unit 241 is disabled. On the other hand, in response to a low voltage signal, transistor P1 is turned on and pull-up unit 241 is enabled, while transistor N1 is turned off and pull-down unit 242 is disabled.

Transistor P2 is connected in parallel with the transistor P3. A gate of the transistor P2 is connected to the source of the transistor N4. A drain of the transistor P2 is connected to the pad 150 and the gate of transistor N4. A source of the transistor P2 is connected to the drain of the transistor P1.

Transistor P3 is a diode-connected transistor. A gate of the transistor P3 is connected to its drain, which in turn are together connected to the pad 150 and the gate of the transistor N4. A source of the transistor P3 is connected to the drain of the transistor P1.

In operation, the n-type transistor N4 is turned on in response to the second range of the voltage level at pad 150. With the resistive device R1, a relatively small current flows from the VDDQ supply via transistor N4 to VSS. Moreover, transistor N4 is expected to operate largely in the saturation region. As a result, a voltage difference Vtn is established between the gate and source of the transistor N4. Since the source of the transistor N4 is connected to the gate of the transistor P2, and the gate of the transistor N4 is connected to the drain of the transistor P2, a same voltage difference Vtn between the gate and drain of the p-type transistor P2 is established. This voltage difference (VGD=Vtn=|Vtp|) ensures that the p-type transistor P2 operates in the sub-threshold region. In the meantime, the transistor P3 is expected to operate largely in the cut-off region. Consequently, a relatively large current flows from the VDDQ supply via transistors P1 and P2 towards the pad 150, connecting the pad 150 to VDDQ. The pull-up unit 241 thus ensures linearity of the post driver 140 in response to the second range of the voltage level at the pad 150.

Furthermore, the n-type transistor N4 is turned off in response to the first range of the voltage level at the pad 150. Transistor P3 is turned on and, due to its diode-connected structure, operates in the saturation region. In the meantime, transistor P2 is expected to operate largely in the saturation region. In an embodiment, transistor P3 is designed with a greater aspect ratio than transistor P2. As a result, a relatively large current flows from the VDDQ supply via transistors P1 and P3 towards the pad 150, connecting the pad 150 to VDDQ. The pull-up unit 241 thus ensures linearity of the post driver 140 in response to the first range of the voltage level at the pad 150. In some embodiments, the aspect ratio of transistor P3 is one and a half times that of transistor P2.

Effectively, the parallel connected transistors P2 and P3 provide linearity for the post driver 140 between the pad 150 and a node (the drain of transistor P1). When the voltage level at the pad 150 falls within the second range, in some embodiments the p-type transistor P2 is turned on and works in the sub-threshold region while the p-type transistor P3 is turned off. Since most of the current flows through the transistor P2, the effective turn-on resistance of the parallel connected structure is dominated by the effective turn-on resistance of the p-type transistor P2. Moreover, when the voltage level at the pad 150 falls within the first range, in some embodiments the p-type transistors P2 and P3 are turned on and work in the saturation region. Since the transistor P3 has a greater aspect ratio than the transistor P2 and thus most of the current flows through the transistor P3, the effective turn-on resistance of the parallel connected structure is dominated by the effective turn-on resistance of the p-type transistor P3.

In some embodiments, the p-type transistor P1 is designed with a smaller aspect ratio than the p-type transistors P2 and P3 so as to meet the I/O leakage current requirement defined by the JEDEC. The pull-up unit 241 described and illustrated in FIG. 2B is advantageous in that, for example, spacing to avoid p-type transistor and n-type transistor from latch-up effects can be reduced, and thus the density of the integrated circuit can be increased. Furthermore, mismatch of threshold voltage between p-type transistor and n-type transistor is alleviated because the gate to drain voltage (VGD) of the transistor P2 is substantially clamped at Vtn when the voltage level at the pad 150 is relatively high, for example, within the second range. In addition, the EM requirement for the resistive device R1 is not strict because the source follower 211 is not used to drive the stage connected to the pad 150. As a result, the resistive device R1 used in the source follower 211 does not occupy a large cell area. In some existing approaches, however, a resistor used to maintain linearity is connected between an output pad (such as the pad 150) and a circuit node (such as the drain of transistor P1). Nevertheless, as the device feature shrinks, to meet the requirement of high output current for a post driver, the resistor size cannot shrink as well, resulting in an undesired area cost to the integrated circuit.

Figures 3A, 3B:
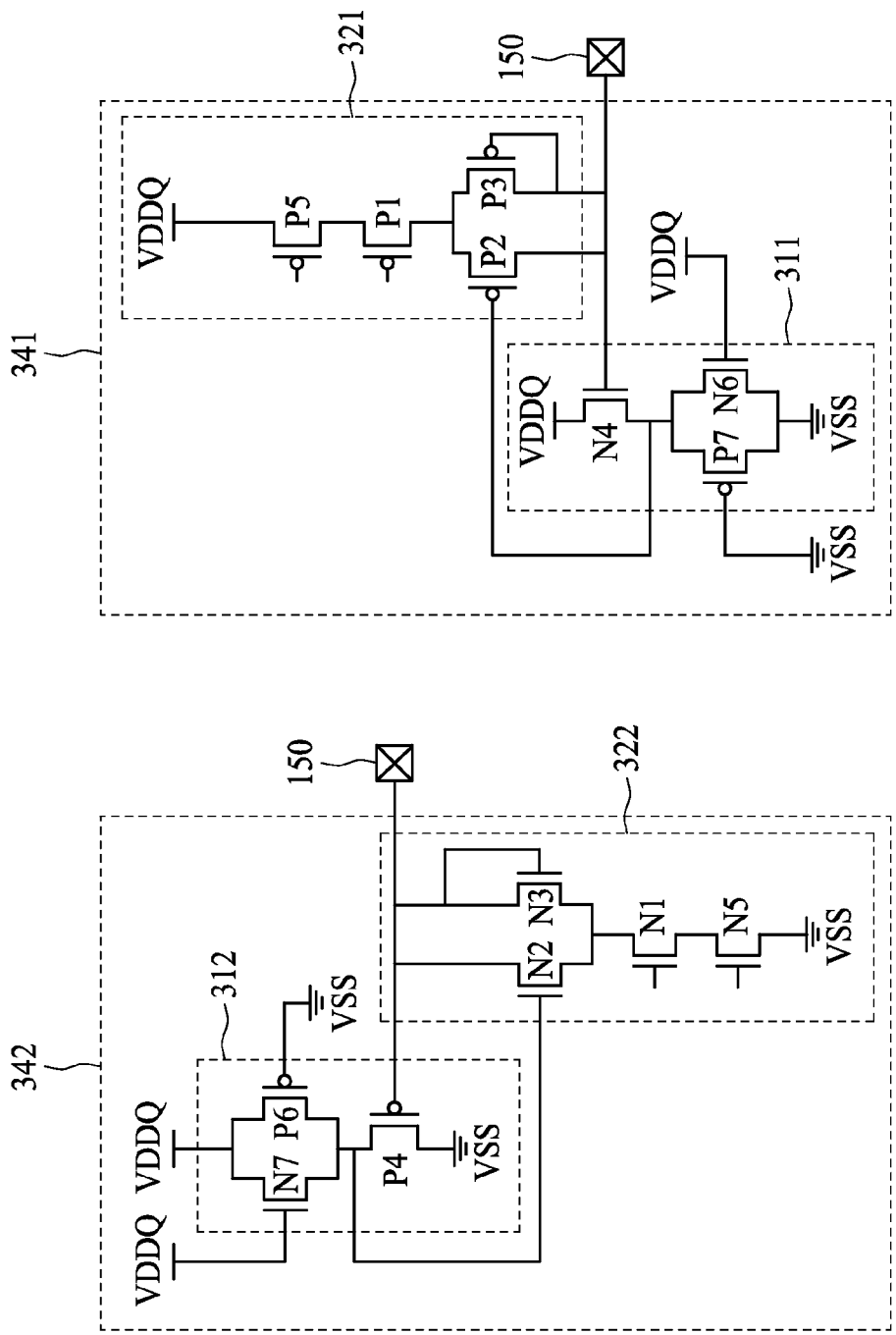
FIG. 3A is a circuit diagram of a pull-down unit of a post driver, in accordance with some embodiments.
FIG. 3B is a circuit diagram of a pull-up unit of a post driver, in accordance with some embodiments.

FIG. 3A is a circuit diagram of a pull-down unit 342 of a post driver, in accordance with some embodiments. Referring to FIG. 3A, the pull-down unit 342 includes a pull-down sub-unit 322 and a source follower 312.

The pull-down sub-unit 322 is similar to the pull-down sub-unit 222 described and illustrated with reference to FIG. 2A except that the pull-down sub-unit 322 further includes an n-type transistor N5. Like transistor N1, transistor N5 also serves as a switch to enable or disable the function of the pull-down sub-unit 322. A gate of the transistor N5 receives a voltage signal (not shown) for controlling the transistor N5 to turn on or turn off. A drain of the transistor N5 is connected to the source of the transistor N1. A source of the transistor N5 receives a reference voltage VSS. As a result, transistor N5 is turned on when its gate is biased at VDDQ, and turned off when its gate is biased at VSS. In some embodiments, the transistor N5 is designed with a smaller aspect ratio smaller than the transistors N1, N2 and N3 so as to enhance the performance on I/O leakage current.

The source follower 312 is similar to the source follower 212 described and illustrated with reference to FIG. 2A except that a pass gate replaces the resistive device R. The pass gate includes an n-type transistor N7 and a p-type transistor P6. A gate and a drain of the transistor N7 receive VDDQ. A source of the transistor N7 is connected to the source of transistor P4 and to the gate of transistor N2. As to the transistor P6, a gate of the transistor P6 receives VSS. A drain of the transistor P6 is connected to the drain of transistor N7 and receives VDDQ. A source of the transistor P6 is connected to the source of the transistor N7, the source of transistor P4 and the gate of transistor N2. The pass gate serves as an active resistor between the VDDQ supply and the source of the transistor P4. Since no passive resistors are used, the pull-down unit 342 can benefit from down-sizing.

FIG. 3B is a circuit diagram of a pull-up unit 341 of a post driver, in accordance with some embodiments. Referring to FIG. 3B, the pull-up unit 341 includes a pull-up sub-unit 321 and a source follower 311.

The pull-up sub-unit 321 is similar to the pull-up sub-unit 221 described and illustrated with reference to FIG. 2B except that the pull-up sub-unit 321 further includes a p-type transistor P5. Like transistor P1, transistor P5 also serves as a switch to enable or disable the function of the pull-up sub-unit 321. A gate of the transistor P5 receives a voltage signal (not shown) for controlling the transistor P5 to turn on or turn off. A drain of the transistor P5 is connected to the source of the transistor P1. A source of the transistor P5 receives VDDQ. As a result, transistor P5 is turned on when its gate is biased at VSS, and turned off when its gate is biased at VDDQ. In some embodiments, the transistor P5 is designed with a smaller aspect ratio smaller than the transistors P1, P2 and P3 so as to enhance the performance on I/O leakage current.

The source follower 311 is similar to the source follower 211 described and illustrated with reference to FIG. 2B except that a pass gate replaces the resistive device R1. The pass gate includes a p-type transistor P7 and an n-type transistor N6. A gate and a drain of the transistor P7 receive VSS. A source of the transistor P7 is connected to the source of transistor N4 and to the gate of transistor P2. As to the transistor N6, a gate of the transistor N6 receives VDDQ. A drain of the transistor N6 is connected to the drain of transistor N7 and receives VDDQ. A source of the transistor P6 is connected to the source of the transistor P7, the source of transistor N4 and the gate of transistor P2. The pass gate serves as an active resistor between the VSS and the source of the transistor N4. Since no passive resistors are used, the pull-up unit 341 can benefit from down-sizing.

Figure 4A:
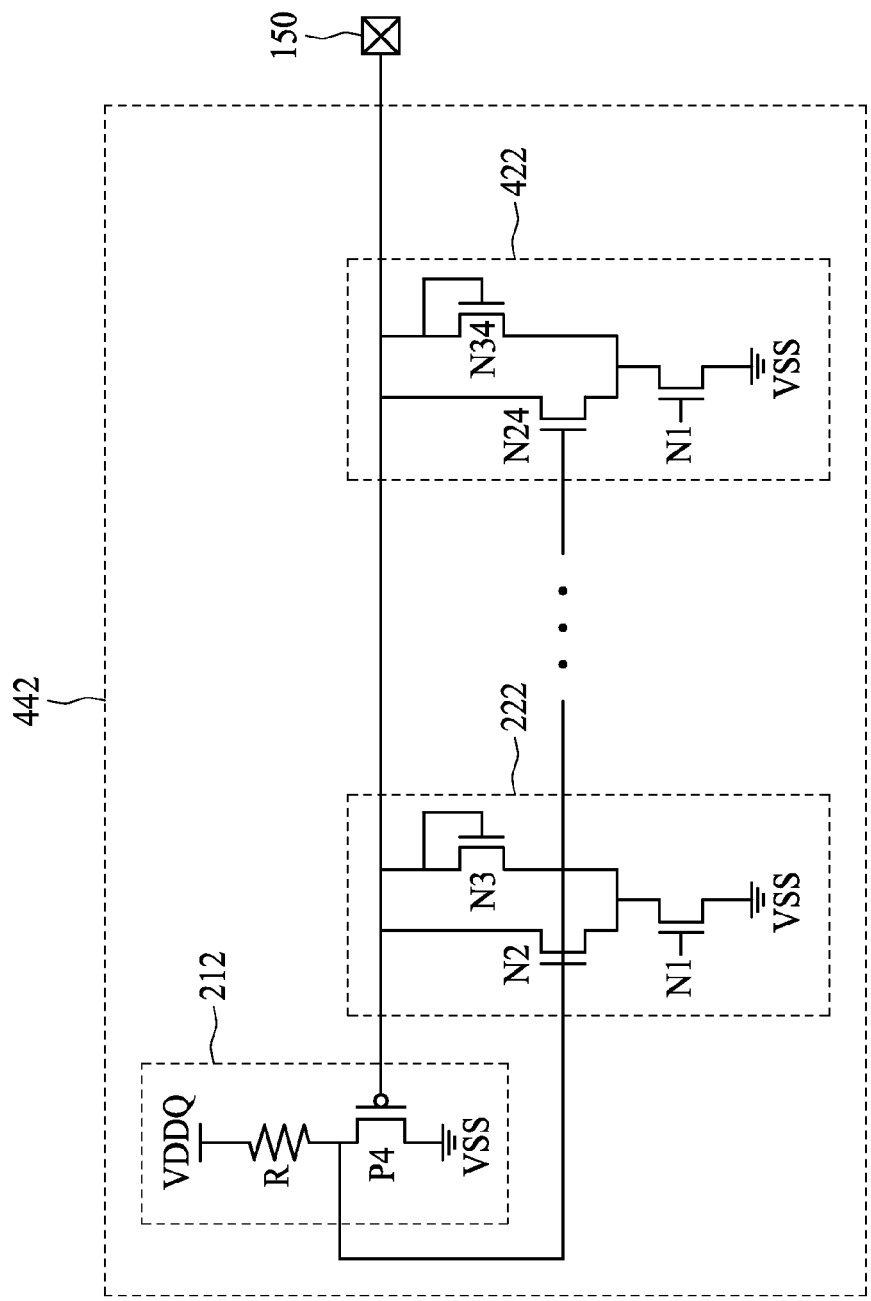
FIG. 4A is a circuit diagram of a pull-down unit of a post driver, in accordance with some embodiments.

FIG. 4A is a circuit diagram of a pull-down unit 422 of a post driver, in accordance with some embodiments. Referring to FIG. 4A, the pull-down unit 442 includes, in addition to the source follower 212 and the pull-down sub-unit 222, one or more pull-down sub-units connected in parallel with the pull-down sub-unit 222 between the pad 150 and VSS. Each of the one or more pull-down sub-units has a circuit structure similar to that of the pull-down sub-unit 222. In some embodiments, several tens of pull-down sub-units are used in the post driver so as to meet the linearity requirement. For illustration, only a first pull-down sub-unit 222 and a second pull-down sub-unit 422 are shown.

In the second pull-down sub-unit 422, similar to the first pull-down sub-unit 222, transistors N24 and N34 are connected in parallel. A gate of the transistor N24 is connected to the source of transistor P4. A drain of the transistor N24 is connected to the pad 150 and the gate of transistor P4. Moreover, the transistor N34 has a diode-connected structure.

To facilitate the linearity of the post driver, the transistors in the pull-down unit 442 can be designed with predetermined aspect ratios. In an embodiment, the diode-connected transistors N3 and N34 respectively in the first and second pull-down sub-units 222 and 422 have a first aspect ratio. Moreover, the transistors N2 and N24 respectively in the first and second pull-down sub-units 222 and 422 have a second aspect ratio. As a result, a same amount of current flows in the first and second pull-down sub-units 222 and 422 when the pull-down sub-units 222 and 422 are enabled.

In another embodiment, the transistors N3 and N34 have a same aspect ratio, and the transistors N2 and N24 have different aspect ratios. In still another embodiment, the transistors N2 and N24 have a same aspect ratio, and the transistors N3 and N34 have different aspect ratios. Either way, different amounts of current flow in the first and second pull-down sub-units 222 and 422 when the pull-down sub-units 222 and 422 are enabled.

In some embodiments, the ratio of transistor N34's aspect ratio to transistor N24's aspect ratio in the second pull-down sub-unit 422 is the same as the ratio of transistor N3's aspect ratio to transistor N2's aspect ratio in the first pull-down sub-unit 222. For example, as previously discussed, the ratio of transistor N3's aspect ratio to transistor N2's aspect ratio in the first pull-down sub-unit 222 is approximately 1.5. In other embodiments, the ratio of transistor N34's aspect ratio to transistor N24's aspect ratio in the second pull-down sub-unit 422 is different from the ratio of transistor N3's aspect ratio to transistor N2's aspect ratio in the first pull-down sub-unit 222.

Figure 4B:
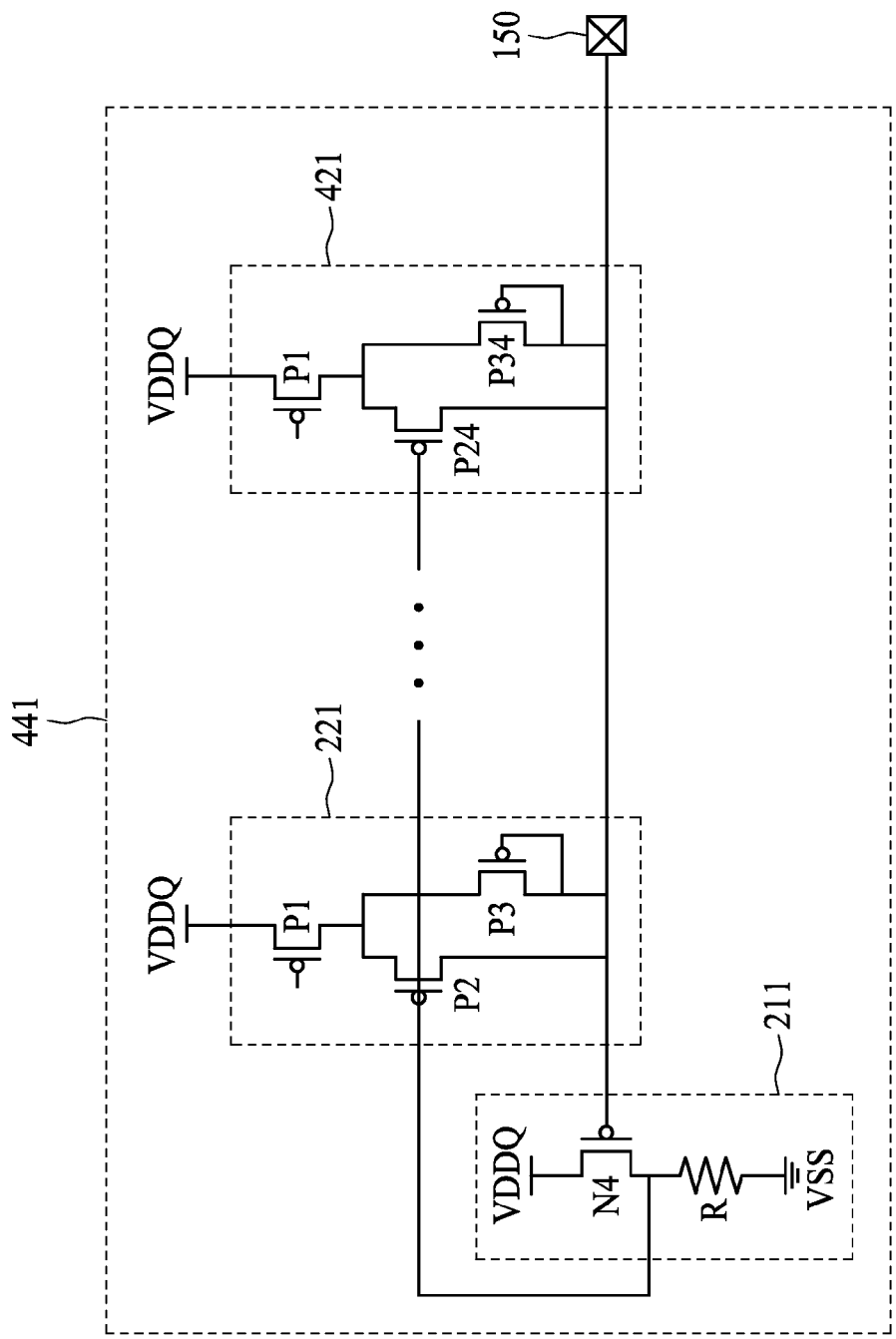
FIG. 4B is a circuit diagram of a pull-up unit of a post driver, in accordance with some embodiments.

FIG. 4B is a circuit diagram of a pull-up unit 441 of a post driver, in accordance with some embodiments. Referring to FIG. 4B, the pull-up unit 441 includes, in addition to the source follower 211 and the pull-up sub-unit 221, one or more pull-up sub-units connected in parallel with the pull-up sub-unit 221 between the pad 150 and VDDQ. Each of the one or more pull-up sub-units has a circuit structure similar to that of the pull-up sub-unit 221. In some embodiments, several tens of pull-up sub-units are used in the post driver so as to meet the linearity requirement. For illustration, only a first pull-up sub-unit 221 and a second pull-up sub-unit 421 are shown.

In the second pull-up sub-unit 421, similar to the first pull-up sub-unit 221, transistors P24 and P34 are connected in parallel. A gate of the transistor P24 is connected to the source of transistor N4. A drain of the transistor P24 is connected to the pad 150 and the gate of transistor N4. Moreover, the transistor P34 has a diode-connected structure.

To facilitate the linearity of the post driver, the transistors in the pull-up unit 441 can be designed with predetermined aspect ratios. In an embodiment, the diode-connected transistors P3 and P34 respectively in the first and second pull-up sub-units 221 and 421 have a first aspect ratio. Moreover, the transistors P2 and P24 respectively in the first and second pull-up sub-units 221 and 421 have a second aspect ratio. As a result, a same amount of current flows in the first and second pull-up sub-units 221 and 421 when the pull-up sub-units 221 and 421 are enabled.

In another embodiment, the transistors P3 and P34 have a same aspect ratio, and the transistors P2 and P24 have different aspect ratios. In still another embodiment, the transistors P2 and P24 have a same aspect ratio, and the transistors P3 and P34 have different aspect ratios. Either way, different amounts of current flow in the first and second pull-up sub-units 221 and 421 when the pull-up sub-units 221 and 421 are enabled.

In some embodiments, the ratio of transistor P34's aspect ratio to transistor P24's aspect ratio in the second pull-up sub-unit 421 is the same as the ratio of transistor P3's aspect ratio to transistor P2's aspect ratio in the first pull-up sub-unit 221. For example, as previously discussed, the ratio of transistor P3's aspect ratio to transistor P2's aspect ratio in the first pull-up sub-unit 221 is approximately 1.5. In other embodiments, the ratio of transistor P34's aspect ratio to transistor P24's aspect ratio in the second pull-up sub-unit 421 is different from the ratio of transistor P3's aspect ratio to transistor P2's aspect ratio in the first pull-up sub-unit 221.

Figure 5:
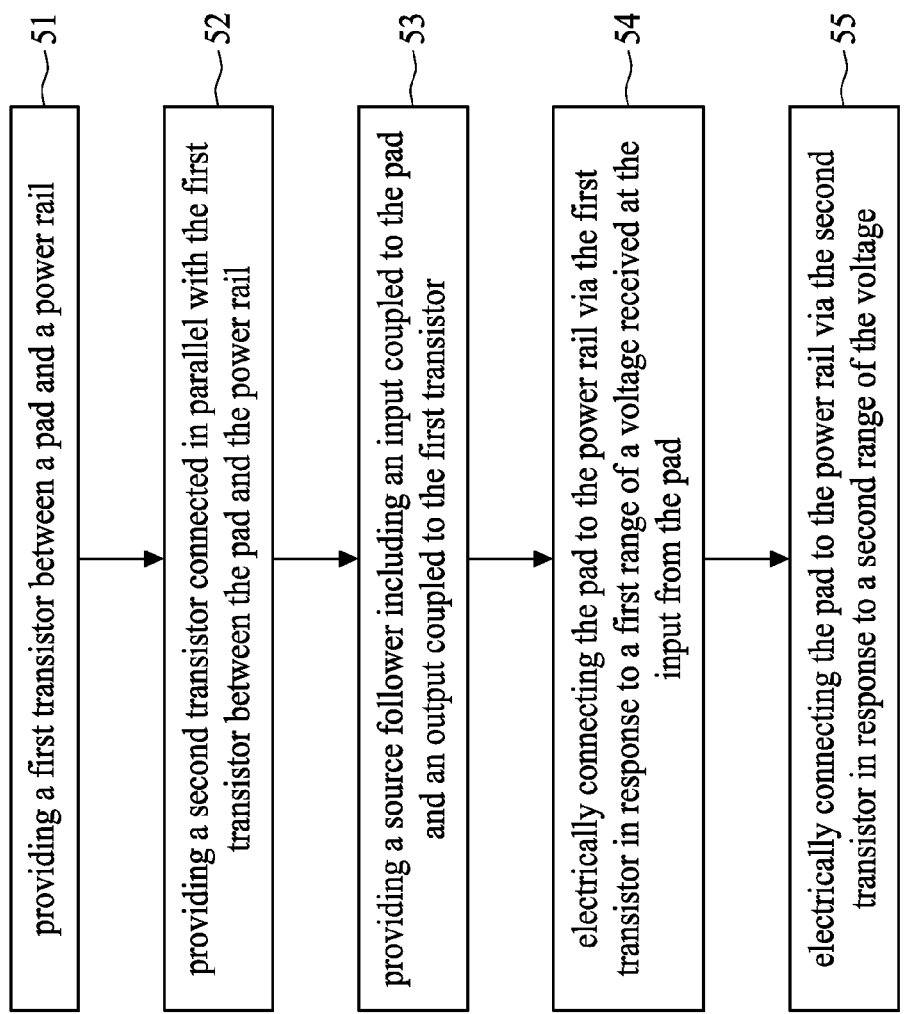
FIG. 5 is a flow diagram showing a method of operating a post driver, in accordance with some embodiments.

FIG. 5 is a flow diagram showing a method of operating a post driver, in accordance with some embodiments. Referring to FIG. 5, in operation 51, a first transistor is provided between a pad and a power rail.

In operation 52, a second transistor connected in parallel with the first transistor is provided between the pad and the power rail.

In operation 53, a source follower including an input coupled to the pad and an output coupled to the first transistor is provided.

Next, in operation 54, the pad is electrically connected to the power rail in response to a first range of a voltage from the pad.

In operation 55, the pad is electrically connected to the power rail via the second transistor in response to a second range of the voltage from the pad.

Figure 6A:
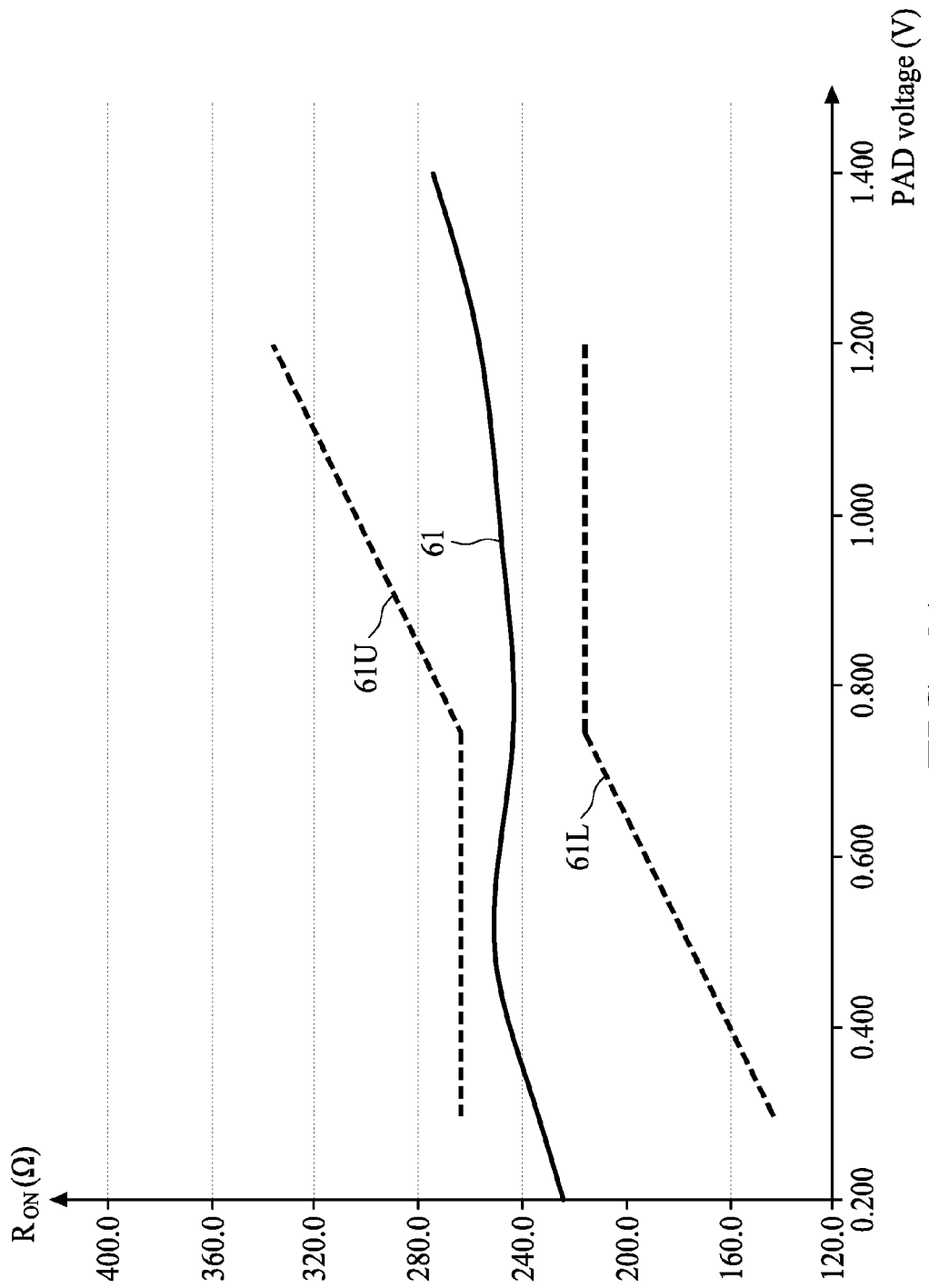
FIG. 6A is a diagram showing simulation results of an exemplary post driver on effective turn-on resistance according to the DDR3 standard.

FIG. 6A is a diagram showing simulation results of an exemplary post driver on effective turn-on resistance according to the DDR3 standard. The exemplary post driver includes the pull-down unit 442 and pull-up unit 441 illustrated and described with reference to FIGS. 4A and 4B, respectively. Referring to FIG. 6A, the x-axis represents the voltage level at an output pad of the exemplary post driver and the y-axis represents the effective turn-on resistance ($R_{ON}$). Moreover, a solid line 61 represents the effective turn-on resistance of the pull-down unit of the exemplary post driver. Dashed lines 61U and 61L represent the upper and lower bounds, respectively, of the effective turn-on resistance defined in accordance with the JEDEC's DDR3 linearity specification. The upper and lower bounds are made according to Table 1. For example, in accordance with the DDR3 standard, the effective turn-on resistances of a pull-down unit measured at 20%, 50% and 80% VDDQ should be in the range of 0.6 to 1.1 times RZQ/7, 0.9 to 1.1 times RZQ/7, and 0.9 to 1.4 times RZQ/7, respectively. Simulation reveals that the exemplary post driver satisfies the DDR3 standard.

Figure 6B:
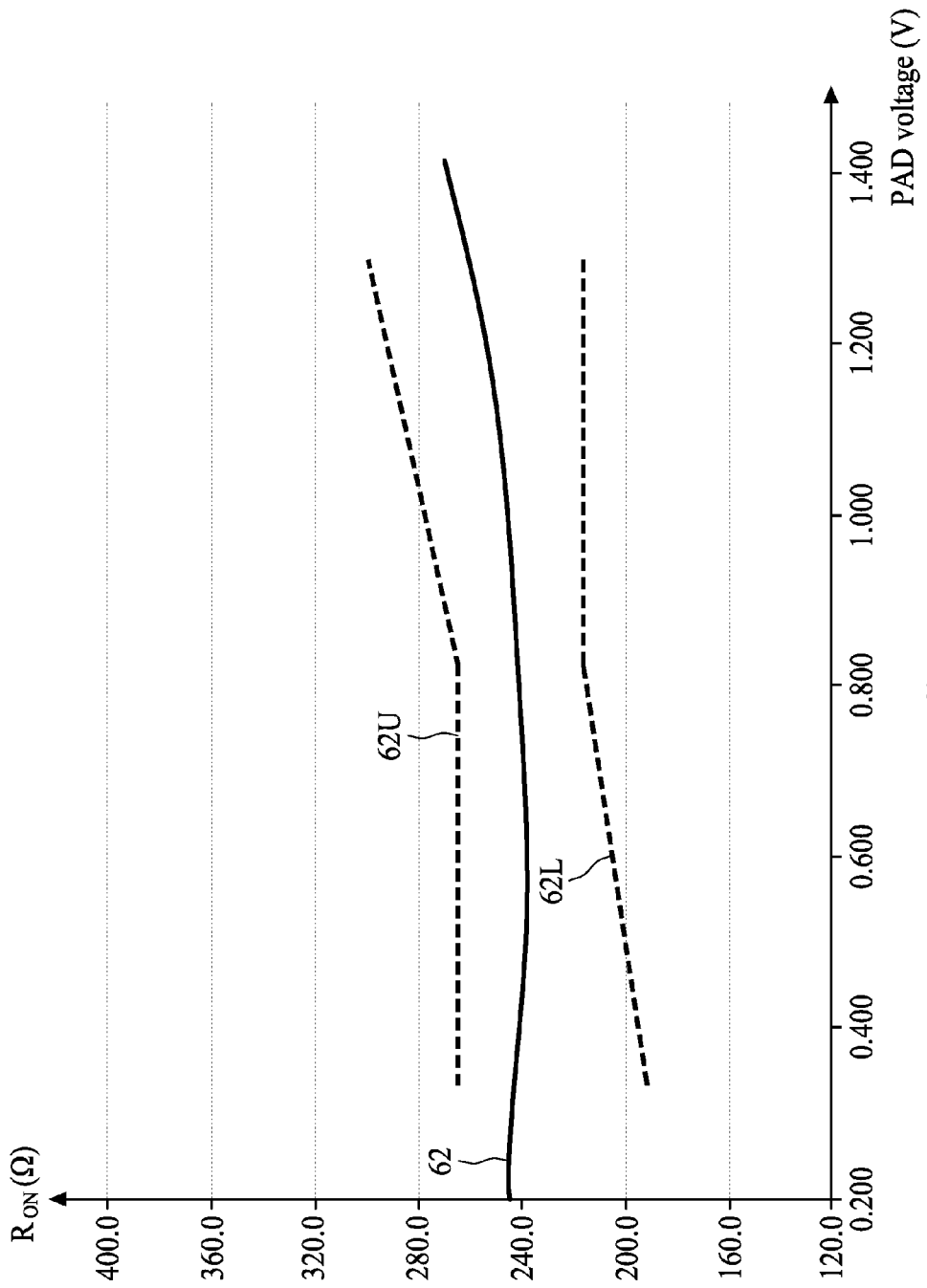
FIG. 6B is a diagram showing simulation results of the exemplary post driver on effective turn-on resistance according to the DDR4 standard.

FIG. 6B is a diagram showing simulation results of the exemplary post driver on effective turn-on resistance according to the DDR4 standard. Referring to FIG. 6B, a solid line 62 represents the effective turn-on resistance of the pull-down unit of the exemplary post driver. Dashed lines 62U and 62L represent the upper and lower bounds, respectively, of the effective turn-on resistance defined in accordance with the JEDEC's DDR4 linearity specification. The upper and lower bounds are made according to Table 1. For example, in accordance with the DDR4 standard, the effective turn-on resistances of a pull-down unit measured at 50%, 80% and 110% VDDQ should be in the range of 0.8 to 1.1 times RZQ/7, 0.9 to 1.1 times RZQ/7, and 0.9 to 1.25 times RZQ/7, respectively. Simulation reveals that the exemplary post driver satisfies the DDR4 standard.

Figure 6C:
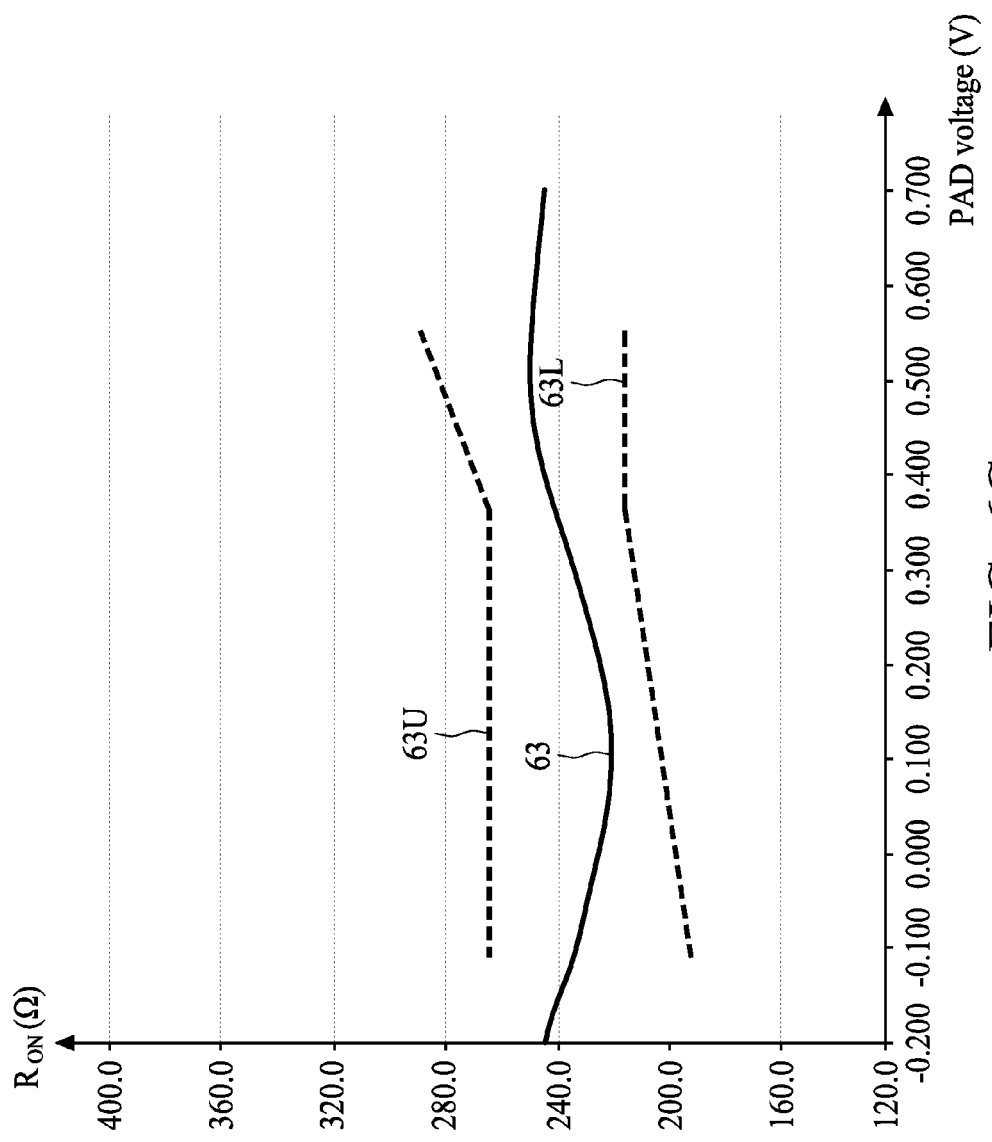
FIG. 6C is a diagram showing simulation results of the exemplary post driver on effective turn-on resistance according to the LPDDR4 standard.

FIG. 6C is a diagram showing simulation results of the exemplary post driver on effective turn-on resistance according to the LPDDR4 standard. Referring to FIG. 6C, a solid line 63 represents the effective turn-on resistance of the pull-down unit of the exemplary post driver. Dashed lines 63U and 63L represent the upper and lower bounds, respectively, of the effective turn-on resistance defined in accordance with the JEDEC's LPDDR4 linearity specification. The upper and lower bounds are made according to Table 1. For example, in accordance with the LPDDR4 standard, the effective turn-on resistance of a pull-down unit measured at −10%, 33% and 50% VDDQ should be in the range of 0.8 to 1.1 times RZQ/7, 0.9 to 1.1 times RZQ/7, and 0.9 to 1.2 times RZQ/7, respectively. Simulation reveals that the exemplary post driver satisfies the JEDEC's LPDDR4 standard.

Embodiments of the present disclosure provide a post driver. The post driver includes a source follower and a first sub-unit. The source follower includes an input to receive a first voltage from a pad, and an output to provide a second voltage. The first sub-unit includes a first transistor and a second transistor. The first transistor, coupled between the pad and a first power rail, is configured to operate in a sub-threshold region in response to the second voltage and a first range of the first voltage. The second transistor, coupled in parallel with the first transistor between the pad and the first power rail, is configured to electrically connect the pad to the first power rail in response to a second range of the first voltage.

In an embodiment, the first transistor includes a gate coupled to the output, a drain coupled to the pad, and a source coupled via a third transistor to the first power rail. Moreover, the second transistor includes a gate coupled to the pad, a drain coupled to the pad, and a source coupled via the third transistor to the first power rail.

In another embodiment, the post driver further includes a fourth transistor coupled between the third transistor and the first power rail. Moreover, the fourth transistor has a smaller aspect ratio than the third transistor.

In still another embodiment, the second transistor has a greater aspect ratio than the first transistor.

In yet another embodiment, the source follower includes a resistive device and a transistor. The resistive device is connected between a second power rail and the output, wherein the first and second power rails provide different voltages. The transistor includes a gate coupled to the pad, a source coupled to the output, and a drain coupled to the second power rail.

In yet still another embodiment, the resistive device includes one of a resistor and a pass gate.

In a further embodiment, the first range of the first voltage ranges from −10% to 50% of the voltage level of the second power rail, and the second range of the first voltage ranges from 50% to 110% of the voltage level of the second power rail.

In another embodiment, the first range of the first voltage ranges from 50% to 110% of the voltage level of the second power rail, and the second range of the first voltage ranges from −10% to 50% of the voltage level of the second power rail.

In still another embodiment, the post driver of claim further includes at least one second sub-unit coupled in parallel with the first sub-unit between the pad and the first power rail. Moreover, each of the at least one second sub-unit includes a first transistor and a second transistor. The first transistor, coupled between the pad and the first power rail, is configured to operate in a sub-threshold region in response to the second voltage and the first range of the first voltage. The second transistor, coupled in parallel with the first transistor between the pad and the first power rail, is configured to electrically connect the pad to the first power rail in response to a second range of the first voltage.

In yet another embodiment, the first transistor in one of the at least one second sub-unit has a same aspect ratio as the first transistor in the first sub-unit.

In yet still another embodiment, the first transistor in one of the at least one second sub-unit has a different aspect ratio from the first transistor in the first sub-unit.

Some embodiments of the present disclosure also provide a post driver. The post driver includes a first transistor, a first source follower, a second transistor and a second source follower. The first transistor is coupled between a pad and a first power rail. The first source follower is configured to cause the first transistor to, in response to a first range of a voltage from the pad, operate in a sub-threshold region. The second transistor is coupled between the pad and a second power rail, wherein the first and second power rails provide different voltages. The second source follower is configured to cause the second transistor to, in response to a second range of the voltage from the pad, operate in a sub-threshold region.

In an embodiment, the post driver further includes a transistor coupled in parallel with the first transistor between the pad and the first power rail. Moreover, the transistor is configured to electrically connect the pad to the first power rail in response to the second range of the voltage from the pad.

In another embodiment, the transistor coupled in parallel with the first transistor has a greater aspect ratio than the first transistor.

In still another embodiment, the post driver further includes a transistor coupled in parallel with the second transistor between the pad and the second power rail. Furthermore, the transistor is configured to electrically connect the pad to the second power rail in response to the first range of the voltage from the pad.

In yet another embodiment, the transistor coupled in parallel with the second transistor has a greater aspect ratio than the first transistor.

In yet still another embodiment, each of the first and second source followers includes a resistive device that further includes one of a resistor and a pass gate.

Embodiments of the present disclosure provide a method of operating a post driver. According to the method, a first transistor is provided between a pad and a power rail. A second transistor connected in parallel with the first transistor is provided between the pad and the power rail. Moreover, a source follower including an input coupled to the pad and an output coupled to the first transistor is provided. The pad is electrically connected to the power rail in response to a first range of a voltage from the pad. Furthermore, the pad is electrically connected to the power rail via the second transistor in response to a second range of the voltage from the pad.

In an embodiment, in electrically connecting the pad to the power rail in response to a first range of a voltage from the pad, the method includes clamping the first transistor to work in a sub-threshold region in response to the first range of the voltage received at the input from the pad.

In another embodiment, the second transistor has a greater aspect ratio than the first transistor.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A post driver, comprising:
 a source follower including an input to receive a first voltage from a pad, and an output to provide a second voltage; and
 a first sub-unit, comprising:
  a first transistor coupled between the pad and a first power rail, the first transistor configured to operate in a sub-threshold region in response to the second voltage and a first range of the first voltage; and
  a second transistor coupled in parallel with the first transistor between the pad and the first power rail, the second transistor configured to electrically connect the pad to the first power rail in response to a second range of the first voltage.

2. The post driver of claim 1, wherein the first transistor includes a gate coupled to the output, a drain coupled to the pad, and a source coupled via a third transistor to the first power rail, and wherein the second transistor includes a gate coupled to the pad, a drain coupled to the pad, and a source coupled via the third transistor to the first power rail.

3. The post driver of claim 2 further comprising a fourth transistor coupled between the third transistor and the first power rail, wherein the fourth transistor has a smaller aspect ratio than the third transistor.

4. The post driver of claim 1, wherein the second transistor has a greater aspect ratio than the first transistor.

5. The post driver of claim 1, wherein the source follower includes:
 a resistive device connected between a second power rail and the output, the first and second power rails providing different voltages; and
 a transistor including a gate coupled to the pad, a source coupled to the output, and a drain coupled to the second power rail.

6. The post driver of claim 5, wherein the resistive device includes one of a resistor and a pass gate.

7. The post driver of claim 5, wherein the first range of the first voltage ranges from −10% to 50% of the voltage level of the second power rail, and the second range of the first voltage ranges from 50% to 110% of the voltage level of the second power rail.

8. The post driver of claim 5, wherein the first range of the first voltage ranges from 50% to 110% of the voltage level of the second power rail, and the second range of the first voltage ranges from −10% to 50% of the voltage level of the second power rail.

9. The post driver of claim 1 further comprising at least one second sub-unit coupled in parallel with the first sub-unit between the pad and the first power rail, wherein each of the at least one second sub-unit includes:
 a first transistor coupled between the pad and the first power rail, the first transistor configured to operate in a sub-threshold region in response to the second voltage and the first range of the first voltage; and
 a second transistor coupled in parallel with the first transistor between the pad and the first power rail, the second transistor configured to electrically connect the pad to the first power rail in response to a second range of the first voltage.

10. The post driver of claim 9, wherein the first transistor in one of the at least one second sub-unit has a same aspect ratio as the first transistor in the first sub-unit.

11. The post driver of claim 9, wherein the first transistor in one of the at least one second sub-unit has a different aspect ratio from the first transistor in the first sub-unit.

12. A post driver, comprising:
 a first transistor coupled between a pad and a first power rail;
 a first source follower configured to cause the first transistor to, in response to a first range of a voltage from the pad, operate in a sub-threshold region;
 a second transistor coupled between the pad and a second power rail, the first and second power rails providing different voltages; and
 a second source follower configured to cause the second transistor to, in response to a second range of the voltage from the pad, operate in a sub-threshold region.

13. The post driver of claim 12 further comprising a transistor coupled in parallel with the first transistor between the pad and the first power rail, the transistor configured to electrically connect the pad to the first power rail in response to the second range of the voltage from the pad.

14. The post driver of claim 13, wherein the transistor has a greater aspect ratio than the first transistor.

15. The post driver of claim 12 further comprising a transistor coupled in parallel with the second transistor between the pad and the second power rail, the transistor configured to electrically connect the pad to the second power rail in response to the first range of the voltage from the pad.

16. The post driver of claim 15, wherein the transistor has a greater aspect ratio than the second transistor.

17. The post driver of claim 12, wherein each of the first and second source followers includes a resistive device selected from one of a resistor and a pass gate.

18. A method of operating a post driver, the method comprising:
 providing a first transistor between a pad and a power rail;
 providing a second transistor connected in parallel with the first transistor between the pad and the power rail;
 providing a source follower including an input coupled to the pad and an output coupled to the first transistor;
 electrically connecting the pad to the power rail in response to a first range of a voltage from the pad; and
 electrically connecting the pad to the power rail via the second transistor in response to a second range of the voltage from the pad.

19. The method of claim 18, wherein electrically connecting the pad to the power rail in response to a first range of a voltage from the pad includes:
 clamping the first transistor to work in a sub-threshold region in response to the first range of the voltage received at the input from the pad.

20. The method of claim 18, wherein the second transistor has a greater aspect ratio than the first transistor.

* * * * *